United States Patent
Yang et al.

(10) Patent No.: US 8,958,237 B1
(45) Date of Patent: Feb. 17, 2015

(54) STATIC RANDOM ACCESS MEMORY TIMING TRACKING CIRCUIT

(71) Applicant: Taiwan Semiconductor Manufacturing Company Limited, Hsinchu (TW)

(72) Inventors: Hao-I Yang, Taipei (TW); Yi-Tzu Chen, Hsinchu (TW); Cheng-Jen Chang, Taoyuan County (TW); Geng-Cing Lin, Taipei (TW); Yu-Hao Hu, Kaohsiung (TW); Chia-Hao Hsu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/078,895

(22) Filed: Nov. 13, 2013

(51) Int. Cl.
*G11C 11/40* (2006.01)
*G11C 11/419* (2006.01)
(52) U.S. Cl.
CPC .................................. *G11C 11/419* (2013.01)
USPC ...................................... 365/154; 365/189.16
(58) Field of Classification Search
CPC ... G11C 11/412; G11C 11/413; G11C 11/419
USPC ........................................... 365/154, 189.16
See application file for complete search history.

(56) References Cited

U.S. PATENT DOCUMENTS

| | | | |
|---|---|---|---|
| 6,573,777 B2 | 6/2003 | Saint-Laurent et al. | |
| 7,359,272 B2 | 4/2008 | Wang et al. | |
| 7,535,788 B2 | 5/2009 | Wu et al. | |
| 8,045,402 B2 * | 10/2011 | Yeung | 365/189.16 |
| 8,363,453 B2 | 1/2013 | Arsovski et al. | |
| 2012/0287736 A1 | 11/2012 | Cheng et al. | |
| 2012/0307574 A1 * | 12/2012 | Cheng et al. | 365/189.14 |
| 2013/0141963 A1 | 6/2013 | Liaw | |

* cited by examiner

*Primary Examiner* — Tan Nguyen
(74) *Attorney, Agent, or Firm* — Jones Day

(57) ABSTRACT

An apparatus and method for executing a write operation in a static random access memory (SRAM) array including memory cells that are coupled to a plurality of word lines and to a plurality of bit lines are provided. A clock signal is generated to start a write operation. A pulse is generated on the plurality of word lines in response to the clock signal. An operation voltage of the SRAM array is lowered for a period of time during the write operation. The period of time is controlled and the pulse is ended using a tracking circuit. The tracking circuit includes a plurality of tracking memory cells. The plurality of tracking memory cells have a timing characteristic that emulates a timing characteristic of the SRAM array during the write operation. The tracking circuit controls the period of time and ends the pulse based on the emulated timing characteristic.

20 Claims, 6 Drawing Sheets

STATIC RANDOM ACCESS MEMORY TIMING TRACKING CIRCUIT

TECHNICAL FIELD

The technology described in this disclosure relates generally to static random access memory (SRAM) and more particularly to an SRAM timing tracking circuit.

BACKGROUND

Modern electronic devices such as notebook computers, smart phones, and tablets may include a variety of memories to store information. Memory circuits include two major categories. One category encompasses volatile memories, and the other category encompasses non-volatile memories. Volatile memories include random access memory (RAM), which may be further divided into two sub-categories, static random access memory (SRAM) and dynamic random access memory (DRAM). Both SRAM and DRAM are volatile because they lose stored information when they are not powered. On the other hand, non-volatile memories may retain stored data even when not powered. Non-volatile memories may include a variety of sub-categories, such as electrically erasable programmable read-only memory (EEPROM) and flash memory.

SRAM cells making up an SRAM memory unit may include different numbers of transistors. An SRAM cell including six transistors may be referred to as a six-transistor (6-T) SRAM, for example. In an SRAM memory chip, SRAM cells may be arranged in rows and columns. An SRAM cell is selected during either a read operation or a write operation by selecting the cell's row and column. The row and column to be selected may be determined by a binary code. For example, a 64 Kb memory chip may employ a 16-bit binary code controlling the write and read operations. More particularly, the 16-bit binary code may be split into two separate 8-bit binary codes for selecting a row and a column, respectively.

SUMMARY

The present disclosure is directed to an apparatus and a method for executing a write operation in a static random access memory (SRAM) array. An apparatus includes an SRAM array comprising memory cells that are coupled to a plurality of word lines and to a plurality of bit lines. A clock signal generated by a clock circuit starts a write operation to the SRAM array and causes a generation of a pulse on the plurality of word lines. The apparatus includes a write assist circuit that is configured to lower an operation voltage of the SRAM array for a period of time during the write operation. The apparatus further includes a tracking circuit configured to control the period of time and end the pulse on the plurality of word lines. The tracking circuit includes a plurality of tracking memory cells, where the plurality of tracking memory cells are arranged in a column and have a timing characteristic that emulates a timing characteristic of the SRAM array during the write operation. The tracking circuit controls the period of time and ends the pulse based on the timing characteristic of the plurality of tracking memory cells.

In another example, in a method for executing a write operation in a static random access memory (SRAM) array including memory cells that are coupled to a plurality of word lines and to a plurality of bit lines, a clock signal is generated to start the write operation. A pulse is generated on the plurality of word lines in response to the clock signal. An operation voltage of the SRAM array is lowered for a period of time during the write operation. The period of time is controlled and the pulse is ended using a tracking circuit. The tracking circuit includes a plurality of tracking memory cells, where the plurality of tracking memory cells are arranged in a column. The plurality of tracking memory cells have a timing characteristic that emulates a timing characteristic of the SRAM array during the write operation. The tracking circuit controls the period of time and ends the pulse based on the timing characteristic of the plurality of tracking memory cells.

In another example, an apparatus includes a static random access memory (SRAM) array comprising SRAM cells that are coupled to a plurality of word lines. A write operation in the SRAM array causes a first pulse on the plurality of word lines and a second pulse on an operation voltage (CVDD) bus of the SRAM array. The apparatus also includes a tracking circuit configured to control pulse widths of the first pulse and the second pulse. The tracking circuit includes tracking memory cells that have a timing characteristic similar to a timing characteristic of the SRAM array during the write operation. The tracking circuit controls the pulse widths based on the timing characteristic of the tracking memory cells.

DETAILED DESCRIPTION

The present disclosure is described with reference to examples in a specific context (i.e., a static random access memory (SRAM) timing tracking circuit). The disclosure may also be applied, however, to a variety of different types of memory and memory circuits.

Figure 1:
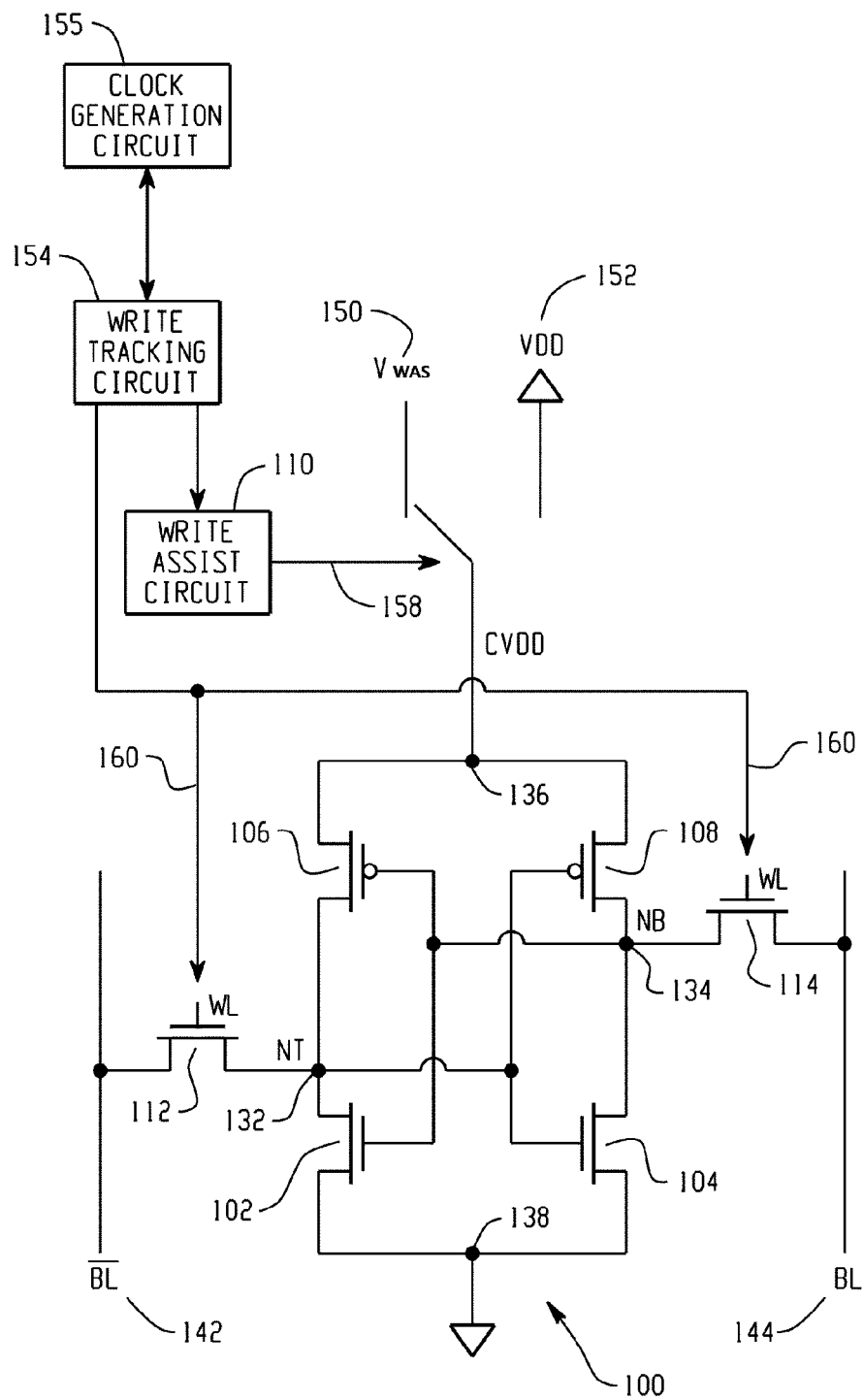
FIG. 1 depicts a schematic diagram of a static random access memory (SRAM) cell that is coupled to a write tracking circuit, where the write tracking circuit is used to track and control aspects of a write operation in the SRAM cell.

FIG. 1 depicts a schematic diagram of a static random access memory (SRAM) cell 100 that is coupled to a write tracking circuit 154, where the write tracking circuit 154 is used to track and control aspects of a write operation in the SRAM cell 100. The SRAM cell 100 includes i) a first inverter formed by a pull-up PMOS transistor 106 and a pull-down NMOS transistor 102, and ii) a second inverter formed by a pull-up PMOS transistor 108 and a pull-down NMOS transistor 104. Both the first inverter and second inverter are coupled between a voltage bus CVDD 136 and ground 138. Furthermore, the first inverter and the second inverter are cross-coupled. That is, the first inverter has an input connected to the output 134 ("NB") of the second inverter. Likewise, the second inverter has an input connected to the output 132 ("NT") of the first inverter. The output 132 of the first inverter is referred to as a storage node NT, and the output 134 of the second inverter is referred to as a storage node NB. In a normal operating mode, the storage node NT is in an opposite logic state as compared to that of the storage node NB. By employing the two cross-coupled inverters, the SRAM cell 100 can hold data using a latched structure.

In an SRAM memory chip, many SRAM memory cells (e.g., cells similar to the SRAM memory cell 100 of FIG. 1) may be arranged in rows and columns. Each column of an SRAM cell may be connected to both a bit-line (BL) 144 and the inverse of BL 142. A data latch of each SRAM cell 100 may be used to store a single bit. Both BL 144 and the inverse of BL 142 may be used to control the operation of reading a bit from or writing a bit into the SRAM cell 100. The SRAM cell 100 further includes a first pass-gate NMOS transistor 112 connected between the inverse of BL 142 and the output 132 of the first inverter. A second pass-gate NMOS transistor 114 is connected between BL 144 and the output 134 of the second inverter. The gates of the first pass-gate NMOS transistor 112 and the second pass-gate NMOS transistor 114 are connected to a word line (WL).

During a write operation, BL 144 and the inverse of BL 142 may be set to opposite logic values according to the new data that is to be written into the SRAM cell 100. When the SRAM cell 100 is selected, a logic high state may be applied to WL so that the data latch is selected to proceed to the write operation. Specifically, a logic state high pulse may be generated on the WL, where the pulse on the WL is generated in response to a clock signal generated by a clock generation circuit 155. As a result of the logic high state pulse applied to the WL, the storage nodes NB 134 and NT 132 may be connected to BL 144 and the inverse of BL 142, respectively. Consequently, the logic values at BL 144 and the inverse of BL 142 may be written into the storage nodes NB 134 and NT 132.

The voltage bus CVDD 136 may be configured such that during a write operation, the voltage bus CVDD 136 is coupled to a write assist voltage potential Vwas 150 through a switch controlled by the write tracking circuit 154. In contrast, when the SRAM cell 100 is not in a write operation mode, the write tracking circuit 154 may turn off the connection between the voltage bus CVDD 136 and the write assist voltage potential Vwas 150 and connect the voltage bus CVDD 136 to a voltage potential VDD 152 (e.g., a high reference voltage). The voltage level of Vwas 150 may be less than the voltage level of VDD 152. By connecting the voltage bus CVDD 136 to the lower voltage potential during the write operation, the write operation may be faster, and the power consumption of the SRAM cell 100 may be decreased.

The write tracking circuit 154 may be coupled to a write assist circuit 110 that is configured to lower the operation voltage of the SRAM cell 100 for a period of time during the write operation by turning off the connection between the voltage bus CVDD 136 and the higher voltage potential VDD 152 and connecting the voltage bus CVDD 136 to the lower write assist voltage potential Vwas 150. The write assist circuit 110 may lower the operation voltage in response to a signal received from the write tracking circuit 154. Although the write assist circuit 110 is depicted as being separate from the write tracking circuit 154, in other examples, the write assist circuit 110 may be integrated within the write tracking circuit 154. Further, in other examples, the write tracking circuit 154 may itself lower the operation voltage of the SRAM cell 100 by directly interacting with the switch used to control the voltage bus CVDD 136.

As described above, during a write operation to the SRAM cell 100, i) a pulse may be generated on the WL, and ii) the operation voltage of the SRAM cell 100 may be lowered to the write assist voltage potential Vwas 150 for a period of time. The write tracking circuit 154 may be configured to end the pulse on the WL and to control the period of time that the lower potential Vwas 150 is applied. These functions of the write tracking circuit 154 are illustrated in FIG. 1. As depicted in the example of FIG. 1, the write tracking circuit 154 outputs a signal to the write assist circuit 110, where the signal is used to control an output 158 of the write assist circuit 110 that controls the switch used to set the voltage bus CVDD 136. The write tracking circuit 154 is further depicted in FIG. 1 as generating output 160 that is coupled to the WL, where the output 160 may be used to end the pulse on the WL.

As described in further detail below, the write tracking circuit 154 may include a plurality of tracking memory cells, where the plurality of tracking memory cells may be arranged in a column. The plurality of tracking memory cells may have a timing characteristic that emulates a timing characteristic of an SRAM array during the write operation. Based on the timing characteristic of the plurality of tracking memory cells, the write tracking circuit 154 may i) control the period of time that the voltage bus CVDD 136 is at the write assist voltage potential 150 and ii) end the pulse generated on the WL.

The connections and couplings illustrated in FIG. 1 are exemplary only. For example, although the write tracking circuit 154 is depicted as having outputs 160 coupled directly to the WL, in other examples, the outputs 160 generated by the write tracking circuit 154 may be received by other modules or circuits that utilize the outputs 160 to control the length of the pulse on the WL. Accordingly, the term "connected" or "coupled" (and such connections and couplings depicted in the figures) signifies but is not limited to a connection between circuits or modules so as to allow signals (e.g., voltages, currents, etc.) to be exchanged directly or indirectly between the circuits or modules. Therefore, connection does not mean solely that a first circuit or module is directly connected to another circuit or module, but also includes a circuit or module sending or receiving a signal indirectly from another circuit or module, such as through one or more different circuits, modules, or components.

Figure 2:
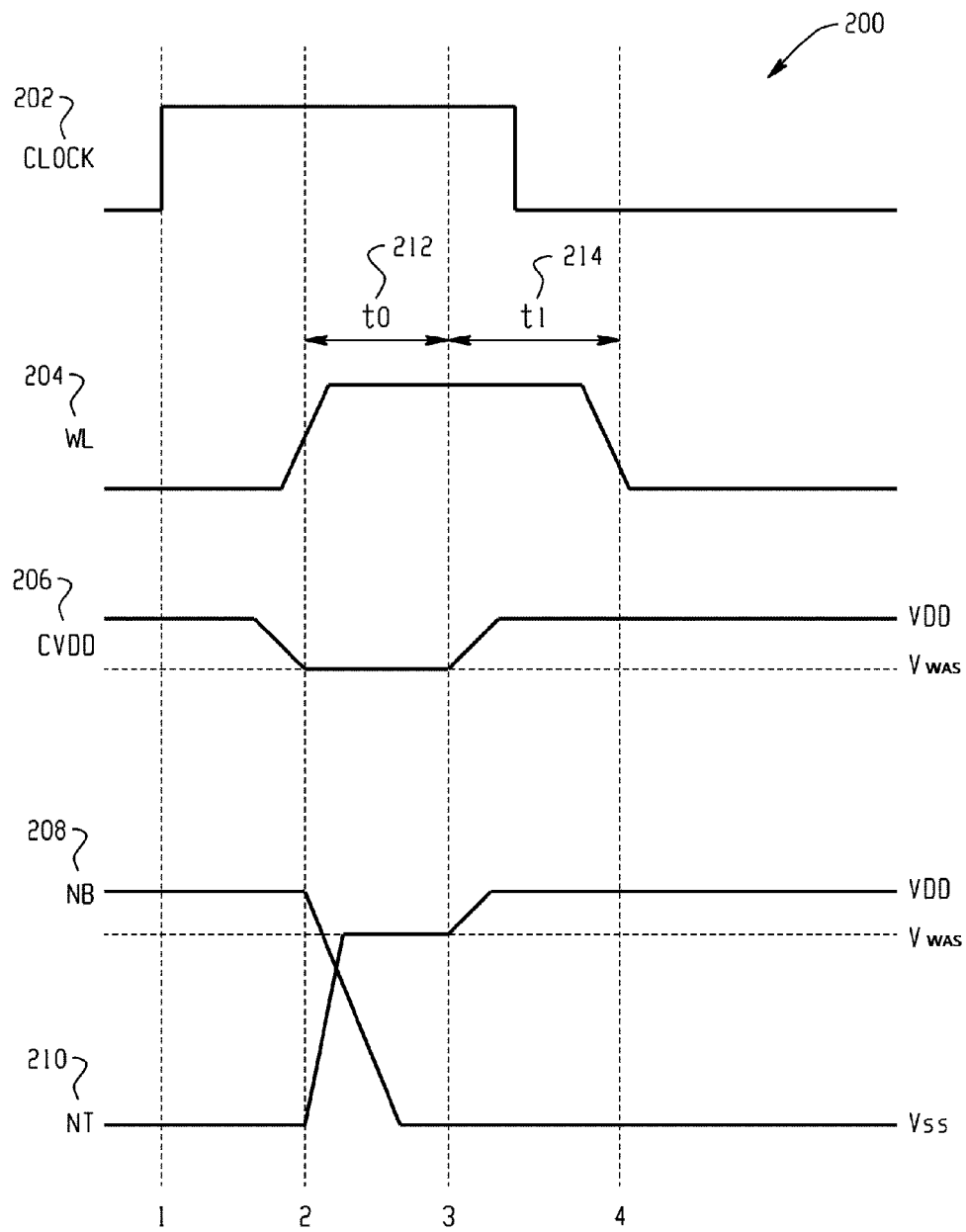
FIG. 2 depicts a timing diagram that illustrates aspects of a write operation in an SRAM cell.

FIG. 2 depicts a timing diagram 200 that illustrates aspects of a write operation in an SRAM cell. In the example of FIG. 2, it is assumed that the initial logic values stored at a storage node NB 208 and a storage node NT 210 are logic high and logic low, respectively. In order to write a bit into the data latch, both BL and the inverse of BL may be set to corresponding logic values. For example, when a logic low state will be written into the storage node NB 208, the bit line BL is set to a logic low state by connecting BL to ground. Likewise, the inverse of BL is set to a logic high state by connecting the inverse of BL to a high voltage potential such as VDD. At a first time instance (labeled by dashed line 1), a leading edge of a write clock signal 202 (e.g., generated by a clock circuit) arrives. In response to the leading edge of the write clock signal 202, at a second time instance (labeled by dashed line 2), a write assist circuit (e.g., the write assist circuit 110 of FIG. 1) may cause a voltage bus CVDD 206 to be connected to a write assist voltage potential Vwas. The connection of the voltage bus CVDD 206 to the write assist voltage potential Vwas may be achieved by toggling a switch (e.g., the three-terminal switch shown in FIG. 1), where the switch is toggled by the write assist circuit.

Further, at the second time instance, in response to the selection of the SRAM cell, a word line (WL) signal 204 coupled to the SRAM cell may rise from a logic low state to a logic high state (e.g., a pulse is generated on the WL). The logic high value on WL 204 may turn on first and second pass-gate NMOS transistors in the SRAM cell (e.g., the first pass-gate NMOS transistor 112 and the second pass-gate NMOS transistor 114, as depicted in FIG. 1). Because BL may be connected to ground, the turn-on of the second pass-gate transistor may start to pull down the voltage of the storage node NB 208. As shown in FIG. 2, the voltage at the storage node NB 208 may be discharged to ground. At the same time, the turn-on of the first pass-gate NMOS transistor may provide a channel to charge the voltage of the storage node NT 210 to a level clamped by the voltage bus CVDD 206. It should be noted that during the period between the second time instance and a third time instance (labeled by dashed line 3), a pull-up PMOS transistor (e.g., the pull-up PMOS transistor 106, as depicted in FIG. 1) may be turned on after the voltage of the storage node NB 134 is discharged below the turn-on threshold of the pull-up PMOS transistor. As a result, the turned-on pull-up PMOS transistor may clamp the voltage of the storage node NT 210 to the write assist voltage potential Vwas. A period of time t0 212 may represent a pulse width of the low-CVDD pulse (e.g., a period of time in which the CVDD operation voltage of the SRAM array is lowered during the write operation).

At the third time instance, the write tracking circuit may cause the voltage bus CVDD 206 to be reconnected to the higher voltage potential VDD. The reconnecting of the voltage bus CVDD 206 to VDD may be referred to herein as "CVDD recovery." The CVDD recovery may be achieved by toggling the switch, where the switch may be toggled by the write assist circuit based on a signal that the write assist circuit receives from the write tracking circuit. As a result, the voltage at the voltage bus CVDD 206 may be charged up from Vwas to VDD. In this manner, the write tracking circuit may control the period of time in which the operation voltage of the SRAM array is lowered during the write operation. Because the turned-on pull up PMOS transistor may connect the storage node NB 208 to the voltage bus CVDD 206, the voltage at the storage node NT 210 may increase following the same curve as the voltage bus CVDD 206 and reach a voltage level of VDD. At a fourth time instance (labeled by dashed line 4), the pulse on the WL 204 may be ended in response to a signal generated by the write tracking circuit. A period of time t1 214 may represent a recovery time of the SRAM cell (e.g., a period of time between the CVDD recovery and a time in which the WL pulse ends).

As described above with reference to FIGS. 1 and 2, a write tracking circuit is used to i) control a period of time in which a CVDD operation voltage of the SRAM array is lowered during a write operation, and ii) end a pulse on the WL that is generated as part of the write operation. The write tracking circuit may perform these functions by adaptively adjusting the time periods t0 212 (i.e., the low-CVDD low pulse width) and t1 214 (i.e., the period of time between the CVDD recovery and the end of the WL pulse). The write tracking circuit and the write assist circuit described herein may be used to improve a write margin in nanoscale SRAM designs. Further, controlling the time periods t0 212 and t1 214 may help to ensure that a write operation does not fail. For example, if t0 212 is too small, the storage node NB 208 may not be able to decrease to Vss, and if t1 214 is too small, the storage node NT 210 may not be able to rise to VDD. If either of these scenarios occur, the write operation may fail. The write tracking circuit described herein may utilize a plurality of tracking memory cells, where the plurality of tracking memory cells may have a timing characteristic that emulates a timing characteristic of the SRAM array to which the write operation is occurring. Specifically, the emulation of the timing characteristic of the SRAM array may include, for example, i) tracking various aspects of the write operation, and ii) tracking the recovery time t1 214 of the SRAM array. The write tracking circuit is configured to be insensitive to process, voltage, and temperature variation within the SRAM array.

Figure 3:
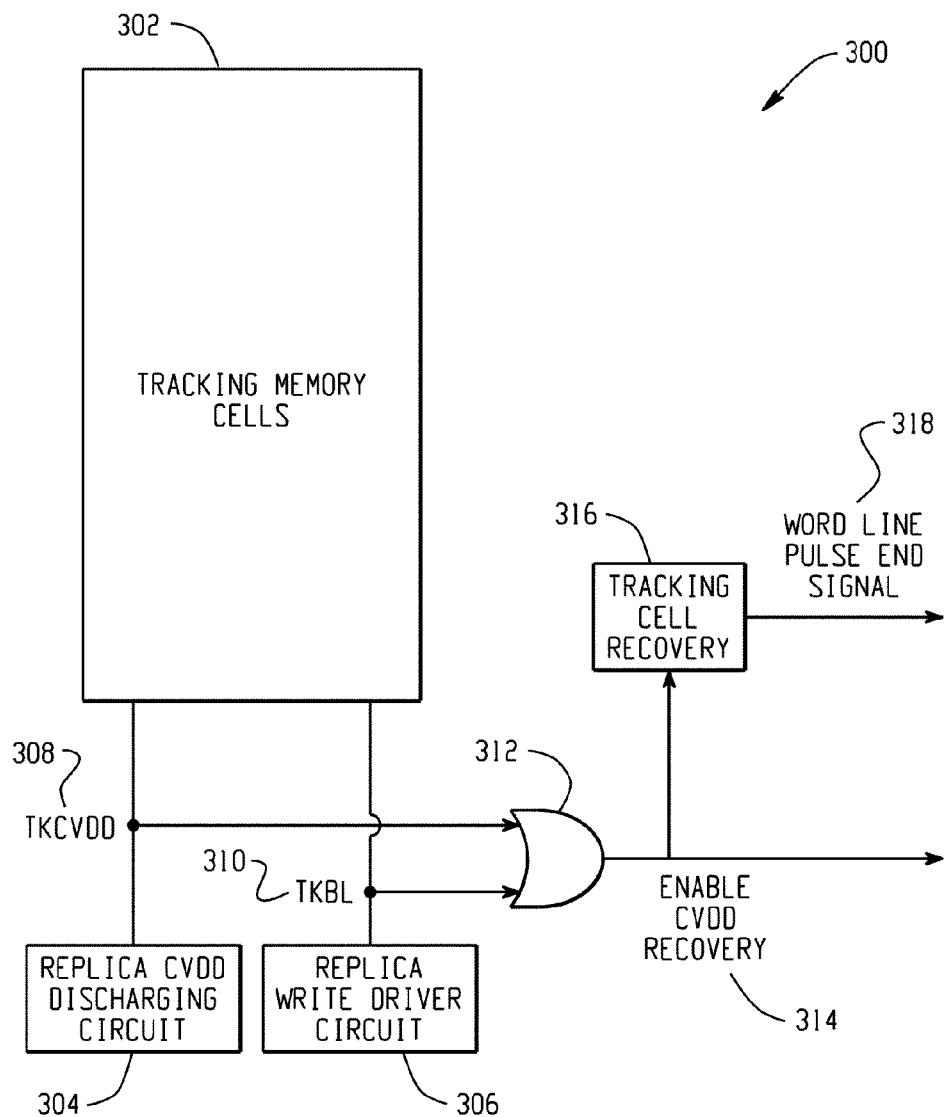
FIG. 3 is a block diagram of a write tracking circuit configured to control a low-CVDD pulse width and a word line pulse width during a write operation in an SRAM array.

FIG. 3 is a block diagram of a write tracking circuit 300 configured to control a low-CVDD pulse width (e.g., the period of time t0 212 in FIG. 2) and a word line (WL) pulse width (e.g., by controlling the period of time t1 214 in FIG. 2) during a write operation in a static random access memory (SRAM) array. The write tracking circuit 300 includes tracking memory cells 302, where the tracking memory cells 302 may have a timing characteristic that emulates a timing characteristic of the SRAM array during the write operation. The write tracking circuit 300 may be coupled to the SRAM array and may be used to control the low-CVDD pulse width and the WL pulse width based on the emulated timing characteristic. In other examples, the write tracking circuit 300 or portions of the write tracking circuit (e.g., the tracking memory cells 302) may be located within the SRAM array itself, such that both local variations (e.g., due to process, temperature, or voltage) and global variations can be emulated. The tracking memory cells 302 may not function as normal SRAM cells that are included in the SRAM array (i.e., the tracking memory cells 302 are not used for storing data). Rather, the tracking memory cells 302 may be SRAM cells that are coupled to one another and that are configured to be used in a tracking capacity (e.g., to emulate and track aspects of the write operation occurring in the SRAM array).

Specifically, the tracking memory cells 302 may be configured to emulate SRAM cells of the SRAM array by emulating i) a loading on a plurality of bit lines of the SRAM array during the write operation (e.g., BL 144 and the inverse of BL 142, as depicted in FIG. 1), and ii) a loading on an operation voltage (CVDD) bus of the SRAM array during the write operation (e.g., CVDD voltage bus 136, as depicted in FIG. 1). The loading on the plurality of bit lines and the CVDD voltage bus 136 may be seen in FIG. 1. For example, as illustrated in FIG. 1, the BL 144 and the inverse of the BL 142 see a load due to the path to ground 138 including various transistors. The CVDD voltage bus 136 similarly sees a load due to the path to ground including the various transistors.

The write tracking circuit 300 may further include an operation voltage (CVDD) tracking line TKCVDD 308 and a bit line (BL) tracking line TKBL 310. The TKCVDD 308 tracking line is coupled to the tracking memory cells 302 and is configured to emulate a timing characteristic of the CVDD bus of the SRAM array during the write operation. Similarly, the TKBL 310 tracking line is coupled to the tracking memory cells 302 and is configured to emulate a timing characteristic of one or more of the plurality of bit lines of the SRAM array during the write operation. Specifically, the tracking lines 308, 310 may be used for emulating and tracking propagation times in the write operation in the SRAM array. As part of the emulating and tracking of propagation times, one or both of the TKCVDD 308 and the TKBL 310 tracking lines may be pre-charged to a logical high voltage value (e.g., high reference voltage Vdd). When the lines 308, 310 are decoupled from the logical high voltage value, current may be allowed to flow from the lines 308, 310 to ground. As part of emulating the timing characteristics of the CVDD bus and the one or more of the plurality of bit lines of the SRAM array during the write operation, the time required for discharge of the lines 308, 310 may be measured for timing tracking purposes.

To provide greater accuracy in tracking aspects of the write operation, a replica CVDD discharging circuit 304 may be coupled to the TKCVDD 308 tracking line, and a replica write driver circuit 306 may be coupled to the TKBL 310 tracking line. The replica CVDD discharging circuit 304 and the replica write driver circuit 306 may be used to emulate a real discharge time of the SRAM array. The replica CVDD discharging circuit 304 is configured to discharge the TKCVDD 308 tracking line to a ground voltage or a low reference voltage (Vss), thus modeling the discharging behavior of a real low CVDD voltage (LCV) circuit of the SRAM array. Similarly, the replica write driver circuit 306 is configured to discharge the TKBL 310 tracking line to the ground voltage or the low reference voltage (Vss), thus modeling the discharging behavior of a real write driver circuit of the SRAM array.

A real write driver in the SRAM array facilitates write operations to the SRAM array, where a switch may be used to connect one of the plurality of bit lines to the write driver. In a typical write operation, after a particular word line has been activated, one of the bit lines (e.g., bit line true) may be brought to ground (GND), while the other bit line (e.g., the bit line complement) may be maintained at a supply voltage (VDD). These actions may discharge the cell and facilitate a write to the cell. In the discharging of one of the bit lines, the write driver of the SRAM array may utilize a variety of different discharge devices (e.g., transistors, etc.). Further, in a typical write operation, the CVDD voltage bus may similarly be discharged using a variety of different discharge devices. The replica CVDD discharging circuit 304 and the replica write driver circuit 306 may thus be configured to emulate a discharging performance of these discharge devices.

The write tracking circuit 300 further includes a circuit 312 configured to generate an "enable CVDD recovery" output 314, where the output 314 may cause the operation voltage of the SRAM array to increase from a write assist voltage potential Vwas to the high reference voltage Vdd. The transition from the write assist voltage potential Vwas to the high reference voltage Vdd is depicted in FIG. 2 at the third time instance, where the CVDD operation voltage 206 is caused to increase from Vwas to Vdd. The output 314 of the circuit 312 may control the low-CVDD pulse width of the write operation, thus controlling the period of time during the write operation that the CVDD operation voltage is lowered. The output 314 may be received, for example, by a write assist circuit (e.g., the write assist circuit 110 of FIG. 1), where the write assist circuit changes the operation voltage of the SRAM array based on the output 314.

In FIG. 3, the circuit 312 is depicted as an "OR" logic element, but in other examples, various other logic elements (e.g., "NOR" logic elements, "NOT" logic elements, etc.) and circuitry may be used to receive voltages, currents, or other signals on the TKCVDD 308 and TKBL 310 tracking lines and to generate the output 314 based on the received voltages, currents, or other signals. In one example, the output 314 of the circuit 312 causes the operation voltage of the SRAM array to increase from Vwas to Vdd when the voltages on both the TKCVDD 308 and TKBL 310 tracking lines are discharged to a ground potential or a low reference voltage (Vss). As described above, the TKCVDD 308 and the TKBL 310 tracking lines may be discharged to the ground potential or the low reference voltage (Vss) by the replica CVDD discharging circuit 304 and the replica write driver circuit 306, respectively.

The output 314 of the circuit 312 may be received by a tracking cell recovery circuit 316. As described above, the output 314 may be a signal that causes the operation voltage of the SRAM array to increase to a high reference voltage (Vdd) (i.e., the output 314 causes CVDD recovery). The tracking cell recovery circuit 316 may track the CVDD recovery time (e.g., the recovery time t1 214, as described above with reference to FIG. 2) using the output 314. The tracking cell recovery circuit 316 may generate a "word line pulse end signal" 318 that is used to end the WL pulse in the SRAM array (e.g., as illustrated at the fourth time instance in FIG. 2, where the WL pulse is caused to end).

The tracking cell recovery circuit 316 may include, for example, an adjustable delay element that is configured to end the WL pulse an amount of time after the CVDD operation voltage of the SRAM array has increased to the high reference voltage (Vdd). The output 318 of the tracking cell recovery circuit 316 may be based on the output 314 of the circuit 312, such that the ending of the WL pulse lags behind the ending of the low-CVDD pulse by an adjustable amount of time. Using the outputs 314 and 318, the write tracking circuit may thus allow pulse width control for both the low-CVDD pulse and the WL pulse. The pulse width control may be achieved at different PVT (e.g., the pulse width control is insensitive to process variation, voltage variation, and temperature variation within the SRAM array).

Figure 4:
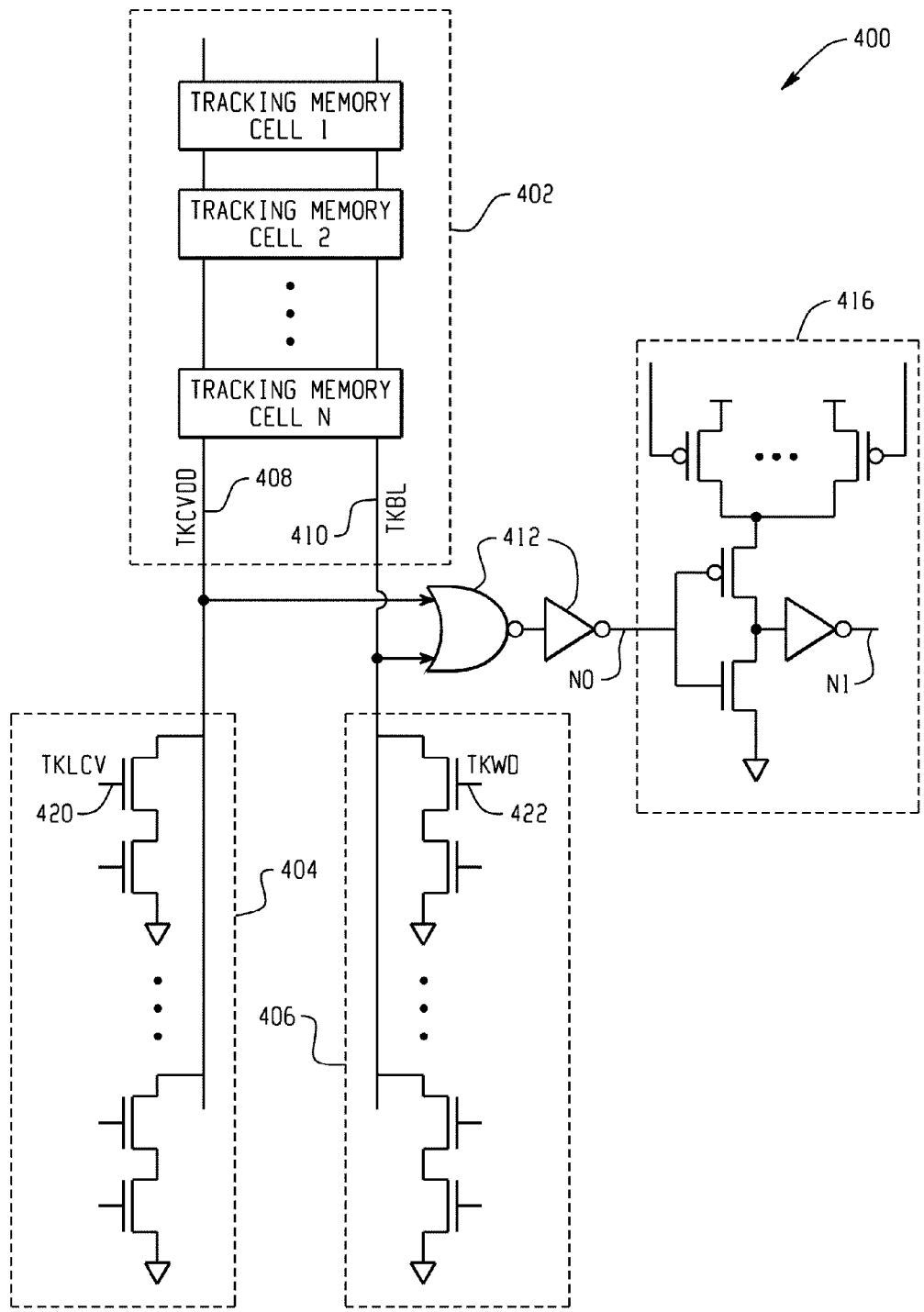
FIG. 4 is a schematic diagram of a write tracking circuit configured to track aspects of a write operation and a recovery time in an SRAM array.

FIG. 4 is a schematic diagram of a write tracking circuit 400 configured to track aspects of a write operation and a recovery time in a static random access memory (SRAM) array. The write tracking circuit 400 includes tracking memory cells 402, where the tracking memory cells 402 may have a timing characteristic that emulates a timing characteristic of the SRAM array during the write operation. As depicted in FIG. 4, the tracking memory cells 402 may include N tracking cells, where certain of the tracking cells are "on cells," and certain of the tracking cells are "off cells." The tracking memory cells 402 may be SRAM cells that are coupled to one another and that are configured to be used in a tracking capacity (e.g., to emulate and track aspects of the write operation occurring in the SRAM array). Specifically, the tracking memory cells 402 may be configured to emulate SRAM cells of the SRAM array by emulating a loading on a plurality of bit lines of the SRAM array during the write operation and a loading on an operation voltage (CVDD) bus of the SRAM array during the write operation. Although the tracking memory cells 402 may be used in the write tracking circuit to track aspects of a write operation, in other examples, the tracking memory cells 402 are additionally used to track aspects of a read operation. Using the tracking memory cells 402 for tracking aspects of both the write operation and the read operation may promote efficient usage of available space on a chip.

The write tracking circuit 400 may further include an operation voltage (CVDD) tracking line TKCVDD 408 and a bit line (BL) tracking line TKBL 410. The TKCVDD 408 tracking line is coupled to the tracking memory cells 402 and may be configured to emulate a timing characteristic of the CVDD bus of the SRAM array during the write operation. Similarly, the TKBL 410 tracking line is coupled to the tracking memory cells 402 and may be configured to emulate a timing characteristic of one or more of the plurality of bit lines of the SRAM array during the write operation. Specifically, the tracking lines 408, 410 may be used for emulating and tracking propagation times in the write operation in the SRAM array. Emulating and tracking the propagation times in the write operation may include pre-charging the lines 408, 410 to logical high voltage values and thereafter discharging the lines 408, 410 to a ground potential or a low reference voltage (Vss). The time required for discharge of the lines 408, 410 may be measured for timing tracking purposes. In other examples, the write tracking circuit may further include a word line (WL) tracking line TKWL, that is monitored for timing tracking purposes.

A replica CVDD discharging circuit 404 is coupled to the TKCVDD 408 tracking line, and a replica write driver circuit 406 is coupled to the TKBL 410 tracking line. The replica CVDD discharging circuit 404 and the replica write driver circuit 406 may be used to emulate a real discharge time of the SRAM array. Thus, the replica CVDD discharging circuit 404 may be configured to discharge the TKCVDD 408 tracking line to a ground voltage or a low reference voltage (Vss), thus modeling the discharging behavior of a real low CVDD voltage (LCV) circuit of the SRAM array. Similarly, the replica write driver circuit 406 may be configured to discharge the TKBL 410 tracking line to the ground voltage or the low reference voltage (Vss), thus modeling the discharging behavior of a real write driver circuit of the SRAM array.

The circuits 404, 406 may each include a plurality of transistors, as illustrated in FIG. 4, where the plurality of transistors form a path through which the tracking lines 408, 410 may be discharged to ground or the low reference voltage (Vss). Various numbers of transistors may be used for the circuits 404, 406, where the numbers used may be selected to provide a most realistic discharging path for the tracking lines 408, 410. Further, the particular arrangement of the plurality of transistors and the connections between the transistors illustrated in FIG. 4 is exemplary only, and various other arrangements and connections may be used. The replica CVDD discharging circuit 404 may receive a TKLCV input 420 on a control pin (e.g., a gate pin) of one or more of the plurality of transistors. The TKLCV input 420 may be used to turn the transistors on, thus allowing them to conduct current and to discharge the TKCVDD tracking line 408. Similarly, the replica write driver circuit 406 may receive a TKWD input 422 on a control pin (e.g., a gate pin) of one or more of the plurality of transistors, where the TKWD input 422 may be used to turn on the transistors of the replica write driver circuit 406.

The write tracking circuit 400 further includes a circuit 412 configured to generate an output "N0," where the output N0 causes the CVDD operation voltage of the SRAM array to increase from a write assist voltage potential Vwas to the high reference voltage Vdd. The output N0 may be received, for example, by a write assist circuit, where the write assist circuit changes the operation voltage of the SRAM array based on the N0 output. In FIG. 4, the circuit 412 is depicted as including a "NOR" logic element and a "NOT" logic element connected in series, but various other components may be used to receive voltages, currents, or other signals on the TKCVDD 408 and TKBL 410 tracking lines and to generate the N0 output based on the received voltages, currents, or other signals. In one example, the N0 output of the circuit 412 causes the operation voltage of the SRAM array to increase from Vwas to Vdd when the voltages on both the TKCVDD 408 and TKBL 410 tracking lines are discharged to a ground potential or a low reference voltage (Vss).

The N0 output of the circuit 412 is received by a tracking cell recovery circuit 416. The tracking cell recovery circuit 416 may track the recovery time of the CVDD operating voltage using the N0 output. Based on its receipt of the N0 output, the tracking cell recovery circuit 416 may generate an output N1 that is used to end the WL pulse in the SRAM array. The tracking cell recovery circuit 416 may include, for example, a delay element implemented by an adjustable inverter. The example of FIG. 4 depicts an example embodiment of the adjustable inverter used to implement the delay element, but various other inverter circuits and various other delay elements may be used in the tracking cell recovery circuit 416. The circuit 416 may use the delay element implemented by the adjustable inverter to end the WL pulse an amount of time after the CVDD operation voltage of the SRAM array has increased to the high reference voltage (Vdd). The N1 output of the tracking cell recovery circuit 416 may be based on the N0 output of the circuit 412, such that the ending of the WL pulse lags behind the ending of the low-CVDD pulse by an adjustable amount of time. Aspects of the write tracking circuit 400 may enable lower power consumption in the SRAM array during the write operation (e.g., lowering the CVDD operation voltage to Vwas during the write operation may enable the lower power consumption).

Figure 5:
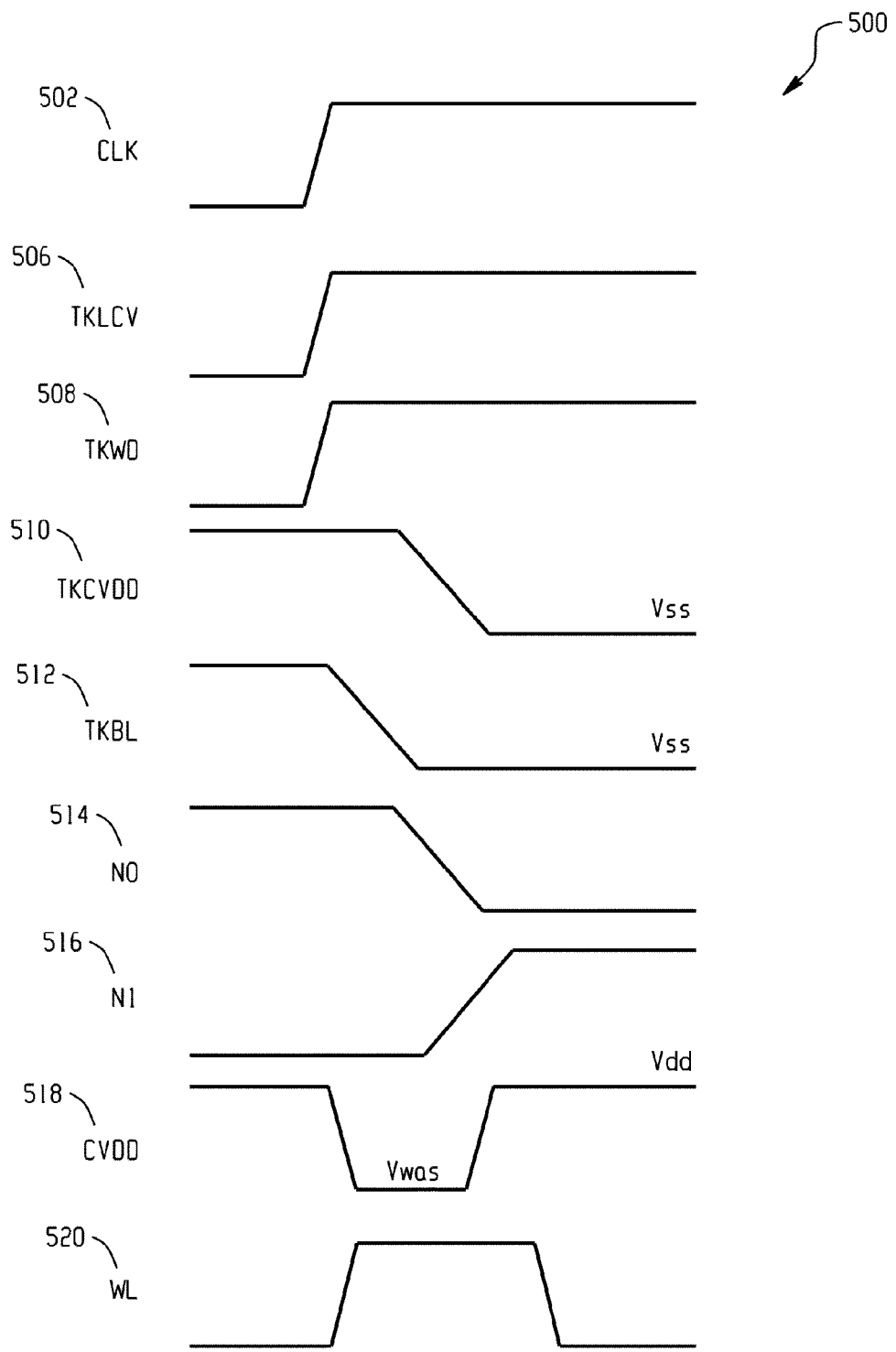
FIG. 5 depicts a signal timing diagram illustrating aspects of a write operation in an SRAM array.

FIG. 5 depicts a signal timing diagram 500 illustrating aspects of a write operation in a static random access memory (SRAM) array. The write operation may be initiated by a clock signal 502 generated by a clock circuit, where the clock signal 502 may have a rising edge that starts the write operation. The clock signal 502 may cause a generation of a pulse on a word line (WL) 520, as illustrated in FIG. 5. A write tracking circuit (e.g., the write tracking circuits 300, 400 described with reference to FIGS. 3 and 4, respectively) may be used to end the pulse on the WL 520, thus controlling the WL 520 pulse width. The clock signal 502 that starts the write operation may also cause a TKCVDD tracking line 510 and a TKBL tracking line 512 to discharge from a logic level high state to a ground potential or a low reference voltage (Vss). As described above, with reference to FIGS. 3 and 4, the TKCVDD tracking line 510 may be coupled to a plurality of tracking memory cells and may be used to emulate a timing characteristic of a CVDD bus of the SRAM array during the write operation. Similarly, the TKBL tracking line 512 may be coupled to the plurality of tracking memory cells and may be used to emulate a timing characteristic of one or more of a plurality of bit lines of the SRAM array during the write operation.

In emulating the timing characteristics, the tracking lines 510, 512 may be discharged from the logic level high state to the ground potential or the low reference voltage (Vss). The time required for the discharging of the tracking lines 510, 512 may better approximate discharging times of the SRAM array by utilizing a replica CVDD discharging circuit and a replica write driver circuit (e.g., circuits 404 and 406 in FIG. 4). To enable the discharging of the tracking lines 510, 512 through the replica CVDD discharging circuit and the replica write driver circuit, signals 506 and 508 may be used, respectively. The signals 506, 508 may be received by the replica CVDD discharging circuit and the replica write driver circuit, respectively, where the signals 506, 508 may turn on transistors included in the replica CVDD discharging circuit and the replica write driver circuit to enable the tracking lines 510, 512 to be discharged to the ground potential or the low reference voltage (Vss).

A signal N0 514 may represent an output of a first circuit (e.g., the circuit 412 of FIG. 4), where the output of the first circuit may cause a CVDD operation voltage 518 of the SRAM array to increase from a write assist potential Vwas to a high reference voltage (Vdd). Specifically, the CVDD operation voltage 518 may increase to Vdd when the signal N0 transitions from a logic level high state to a logic level low state. The signal N0 514 may transition from the logic level high state to the logic level low state at a point in time in which both of the TKCVDD 510 and TKBL 512 tracking lines are at the low reference voltage (Vss). Thus, CVDD recovery may occur (i.e., the CVDD operation voltage 518 increases from Vwas to Vdd) when both of the TKCVDD 510 and TKBL 512 tracking lines are at the low reference voltage (Vss).

A signal N1 516 may transition from a logic level low state to a logic level high state an amount of time after the high-to-low transition in the signal N0 514. The transition in the signal N1 516 thus lags behind the transition in the signal N0 514 an amount of time, where the amount of time may be controlled using an adjustable delay element (e.g., the delay element 416 including the adjustable inverter, as illustrated in FIG. 4). The signal N1 516 may be used to end the pulse on the WL 520, as illustrated in the timing diagram 500 of FIG. 5.

Figure 6:
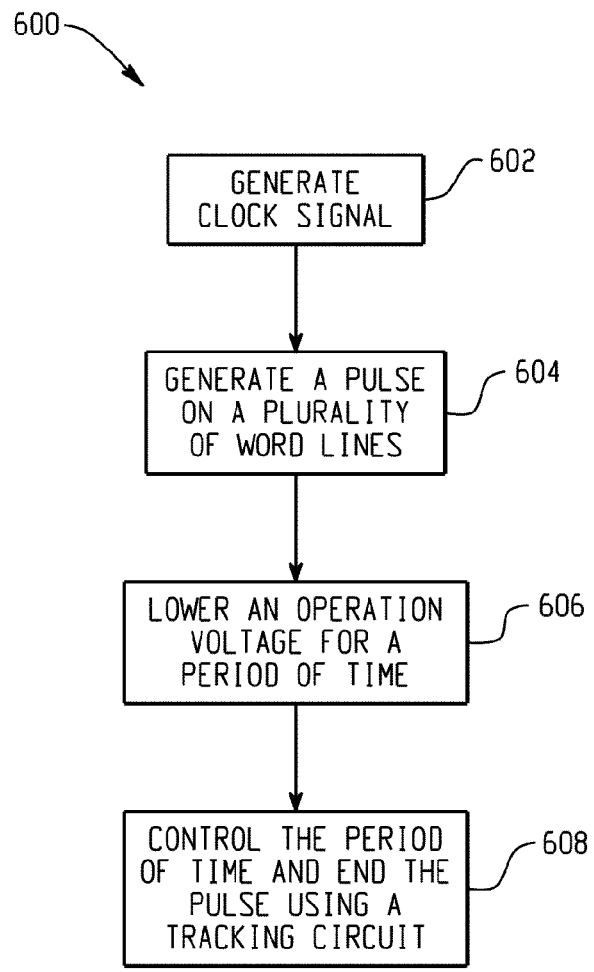
FIG. 6 is a flowchart illustrating an example method for executing a write operation in an SRAM array including memory cells that are coupled to a plurality of word lines and to a plurality of bit lines.

FIG. 6 is a flowchart 600 illustrating an example method for executing a write operation in an SRAM array including memory cells that are coupled to a plurality of word lines and to a plurality of bit lines. At 602, a clock signal may be generated to start the write operation. At 604, a pulse may be generated on the plurality of word lines in response to the clock signal. At 606, an operation voltage of the SRAM array may be lowered for a period of time during the write operation. The period of time may be controlled and the pulse may be ended using a tracking circuit, where the tracking circuit includes a plurality of tracking memory cells. The plurality of tracking memory cells may be arranged in a column and may have a timing characteristic that emulates a timing characteristic of the SRAM array during the write operation. The tracking circuit may control the period of time and end the pulse based on the timing characteristic of the plurality of tracking memory cells.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. An apparatus, comprising:
    a static random access memory (SRAM) array comprising memory cells that are coupled to a plurality of word lines and to a plurality of bit lines, wherein a clock signal generated by a clock circuit starts a write operation to the SRAM array and causes a generation of a pulse on the plurality of word lines;
    a write assist circuit configured to lower an operation voltage of the SRAM array for a period of time during the write operation; and
    a tracking circuit configured to i) control the period of time, and ii) end the pulse on the plurality of word lines, the tracking circuit including:
        a plurality of tracking memory cells, wherein the plurality of tracking memory cells are arranged in a column and have a timing characteristic that emulates a timing characteristic of the SRAM array during the write operation, and
        wherein the tracking circuit controls the period of time and ends the pulse based on the timing characteristic of the plurality of tracking memory cells.

2. The apparatus of claim 1, wherein the plurality of tracking memory cells are configured to emulate a loading on the plurality of bit lines of the SRAM array during the write operation, and to emulate a loading on an operation voltage (CVDD) bus of the SRAM array during the write operation.

3. The apparatus of claim 2, further comprising:
    an operation voltage (CVDD) tracking line coupled to the plurality of tracking memory cells, wherein the CVDD tracking line is configured to emulate a timing characteristic of the CVDD bus of the SRAM array during the write operation; and
    a bit line (BL) tracking line coupled to the plurality of tracking memory cells, wherein the BL tracking line is configured to emulate a timing characteristic of one or more of the plurality of bit lines of the SRAM array during the write operation.

4. The apparatus of claim 3, further comprising:
    a replica CVDD discharging circuit coupled to the CVDD tracking line and configured to lower the CVDD tracking line to a ground voltage or a low reference voltage (Vss); and
    a replica write driver circuit coupled to the BL tracking line and configured to lower the BL tracking line to the ground voltage or the low reference voltage (Vss),
    wherein the replica CVDD discharging circuit and the replica write driver circuit are configured to emulate performance of a CVDD discharging circuit of the SRAM array and a write driver circuit of the SRAM array, respectively, during the write operation.

5. The apparatus of claim 4, wherein the replica CVDD discharging circuit includes a first plurality of transistors through which the CVDD tracking line is discharged to the ground voltage or the low reference voltage (Vss), and wherein the replica write driver circuit includes a second plurality of transistors through which the BL tracking line is discharged to the ground voltage or the low reference voltage (Vss).

6. The apparatus of claim 4, further comprising:
    a first circuit configured to control the period of time, the first circuit being coupled to the CVDD tracking line and the BL tracking line and being configured to generate a first signal based on voltages on the CVDD tracking line and the BL tracking line, wherein the first signal causes the operation voltage of the SRAM array to increase to a high reference voltage (Vdd); and
    a second circuit coupled to the first circuit and configured to generate a second signal to end the pulse on the plurality of word lines, the second circuit comprising an adjustable delay element configured to end the pulse an amount of time after the operation voltage of the SRAM array has increased to the high reference voltage (Vdd), wherein the second signal is generated based on the first signal.

7. The apparatus of claim 6, wherein the adjustable delay element includes an adjustable inverter that controls the amount of time.

8. The apparatus of claim 6, wherein the first circuit includes an "OR" logic element or a "NOR" logic element, and wherein the operation voltage of the SRAM array increases to the high reference voltage (Vdd) when the voltages on both the CVDD tracking line and the BL tracking line are discharged to the ground voltage or the low reference voltage (Vss) by the replica CVDD discharging circuit and the replica write driver, respectively.

9. The apparatus of claim 1, wherein in controlling the period of time and ending the pulse on the plurality of word lines, the tracking circuit is not sensitive to process variation, voltage variation, or temperature variation within the SRAM array.

10. The apparatus of claim 1, wherein the tracking circuit is configured to control i) a pulse width of the pulse on the plurality of word lines, and ii) a pulse width of a second pulse on an operation voltage (CVDD) bus of the SRAM array, and wherein the pulse width of the second pulse is approximately equal to the period of time.

11. A method for executing a write operation in a static random access memory (SRAM) array including memory cells that are coupled to a plurality of word lines and to a plurality of bit lines, the method comprising:
generating a clock signal to start the write operation;
generating a pulse on the plurality of word lines in response to the clock signal;
lowering an operation voltage of the SRAM array for a period of time during the write operation; and
controlling the period of time and ending the pulse using a tracking circuit, the tracking circuit including:
a plurality of tracking memory cells, wherein the plurality of tracking memory cells are arranged in a column and have a timing characteristic that emulates a timing characteristic of the SRAM array during the write operation, and
wherein the tracking circuit controls the period of time and ends the pulse based on the timing characteristic of the plurality of tracking memory cells.

12. The method of claim 11, further comprising:
emulating, using the plurality of tracking memory cells, a loading on the plurality of bit lines of the SRAM array during the write operation; and
emulating, using the plurality of tracking memory cells, a loading on an operation voltage (CVDD) bus of the SRAM array during the write operation.

13. The method of claim 12, wherein the plurality of tracking memory cells are coupled to an operation voltage (CVDD) tracking line and to a bit line (BL) tracking line, the method further comprising:
emulating, using the CVDD tracking line, a timing characteristic of the CVDD bus of the SRAM array during the write operation; and
emulating, using the BL tracking line, a timing characteristic of one or more of the plurality of bit lines of the SRAM array during the write operation.

14. The method of claim 13, further comprising:
lowering, using a replica CVDD discharging circuit, the CVDD tracking line to a ground voltage or a low reference voltage (Vss), wherein the replica CVDD discharging circuit is coupled to the CVDD tracking line; and
lowering, using a replica write driver circuit, the BL tracking line to the ground voltage or the low reference voltage (Vss), wherein the replica write driver circuit is coupled to the BL tracking line, and
wherein the replica CVDD discharging circuit and the replica write driver circuit are configured to emulate performance of a CVDD discharging circuit of the SRAM array and a write driver circuit of the SRAM array, respectively, during the write operation.

15. The method of claim 14, further comprising:
lowering the CVDD tracking line to the ground voltage or the low reference voltage (Vss), wherein the replica CVDD discharging circuit includes a first plurality of transistors through which the CVDD tracking line is discharged to the ground voltage or the low reference voltage (Vss); and
lowering the BL tracking line to the ground voltage or the low reference voltage (Vss), wherein the replica write driver circuit includes a second plurality of transistors through which the BL tracking line is discharged to the ground voltage or the low reference voltage (Vss).

16. The method of claim 14, further comprising:
controlling the first time period using a first circuit, the first circuit being coupled to the CVDD tracking line and the BL tracking line and being configured to generate a first signal based on voltages on the CVDD tracking line and the BL tracking line, wherein the first signal causes the operation voltage of the SRAM array to increase to a high reference voltage (Vdd); and
generating a second signal to end the pulse on the plurality of word lines using a second circuit that is coupled to the first circuit, wherein the second circuit includes an adjustable delay element configured to end the pulse an amount of time after the operation voltage of the SRAM array has increased to the high reference voltage (Vdd), and wherein the second signal is generated based on the first signal.

17. The method of claim 16, further comprising:
generating the second signal using the second circuit, wherein the second circuit includes the adjustable delay element, and wherein the adjustable delay element includes an adjustable inverter that controls the amount of time.

18. The method of claim 16, further comprising:
controlling the first time period using the first circuit, wherein the first circuit includes an "OR" logic element or a "NOR" logic element, and wherein the operation voltage of the SRAM array is caused to increase to the high reference voltage (Vdd) when the voltages on both the CVDD tracking line and the BL tracking line are discharged to the ground voltage or the low reference voltage (Vss) by the replica CVDD discharging circuit and the replica write driver circuit, respectively.

19. The method of claim 11, wherein the tracking circuit is configured to control i) a pulse width of the pulse on the plurality of word lines, and ii) a pulse width of a second pulse on an operation voltage (CVDD) bus of the SRAM array, wherein the pulse width of the second pulse is approximately equal to the period of time.

20. An apparatus, comprising:
a static random access memory (SRAM) array comprising SRAM cells that are coupled to a plurality of word lines, wherein a write operation in the SRAM array causes i) a first pulse on the plurality of word lines, and ii) a second pulse on an operation voltage (CVDD) bus of the SRAM array; and
a tracking circuit configured to control pulse widths of the first pulse and the second pulse, the tracking circuit including tracking memory cells that have a timing characteristic similar to a timing characteristic of the SRAM array during the write operation, wherein the tracking circuit controls the pulse widths based on the timing characteristic of the tracking memory cells.

* * * * *